United States Patent
Imai et al.

(10) Patent No.: US 11,460,524 B2
(45) Date of Patent: Oct. 4, 2022

(54) RADIO FREQUENCY COIL

(71) Applicant: CANON MEDICAL SYSTEMS CORPORATION, Otawara (JP)

(72) Inventors: Satoshi Imai, Nasushiobara (JP); Sadanori Tomiha, Nasushiobara (JP); Masahiro Fukushima, Utsunomiya (JP); Misaki Kobayashi, Sakura (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/210,625

(22) Filed: Mar. 24, 2021

(65) Prior Publication Data

US 2021/0302515 A1 Sep. 30, 2021

(30) Foreign Application Priority Data

Mar. 31, 2020 (JP) .............................. JP2020-064378

(51) Int. Cl.
  *G01R 33/34* (2006.01)
(52) U.S. Cl.
  CPC .............................. *G01R 33/34084* (2013.01)
(58) Field of Classification Search
  CPC .............................................. G01R 33/34084
  See application file for complete search history.

(56) References Cited

U.S. PATENT DOCUMENTS

2019/0383891 A1* 12/2019 Iwasawa ............ G01R 33/3642
2020/0018808 A1* 1/2020 Ji ........................ A61B 5/1102

OTHER PUBLICATIONS

Port et al., "Towards Wearable MR Detection: A Stretchable Wrist Array With On-Body Digitization" Proc, Intl. Soc. Mag. Reson. Med 26, 2018, 4 pages.
Port et al., "Liquid Metal In Stretchable Tubes: A Wearable 4-Channel Knee Array" Proc, Intl. Soc. Mag. Reson. Med 27, 2019, 4 pages.

* cited by examiner

*Primary Examiner* — G. M. A Hyder
(74) *Attorney, Agent, or Firm* — Oblon, McClelland, Maier & Neustadt, L.L.P.

(57) ABSTRACT

A radio frequency coil according to an embodiment is configured to receive a magnetic resonance signal from an examined subject. The radio frequency coil includes an expandable and contractible first element and an expandable and contractible second element. The radio frequency coil has an overlap region where a first loop formed by the first element overlaps with a second loop formed by the second element. The ratio of the area of the overlap region to the area of the region enclosed by the first loop changes in accordance with expansion/contraction of the first element forming the first loop. The first element and the second element include liquid metal in at least a part thereof.

20 Claims, 5 Drawing Sheets

RADIO FREQUENCY COIL

CROSS-REFERENCE TO RELATED APPLICATIONS

This application is based upon and claims the benefit of priority from Japanese Patent Application No. 2020-064378, filed on Mar. 31, 2020; the entire contents of which are incorporated herein by reference.

FIELD

Embodiments described herein relate generally to a radio frequency coil.

BACKGROUND

In the field related to Magnetic Resonance Imaging (MRI), techniques for forming an expandable and contractible Radio Frequency (RF) coil have conventionally been disclosed.

DETAILED DESCRIPTION

Exemplary embodiments of a radio frequency coil will be explained in detail below, with reference to the accompanying drawings.

First Embodiment

A radio frequency coil according to an embodiment is configured to receive a magnetic resonance signal from an examined subject. The radio frequency coil includes an expandable and contractible first element and an expandable and contractible second element. The radio frequency coil has an overlap region where a first loop formed by the first element overlaps with a second loop formed by the second element. The ratio of the area of the overlap region to the area of the region enclosed by the first loop changes in accordance with expansion/contraction of the first element forming the first loop. The first element and the second element include liquid metal in at least a part thereof.

Figure 1:
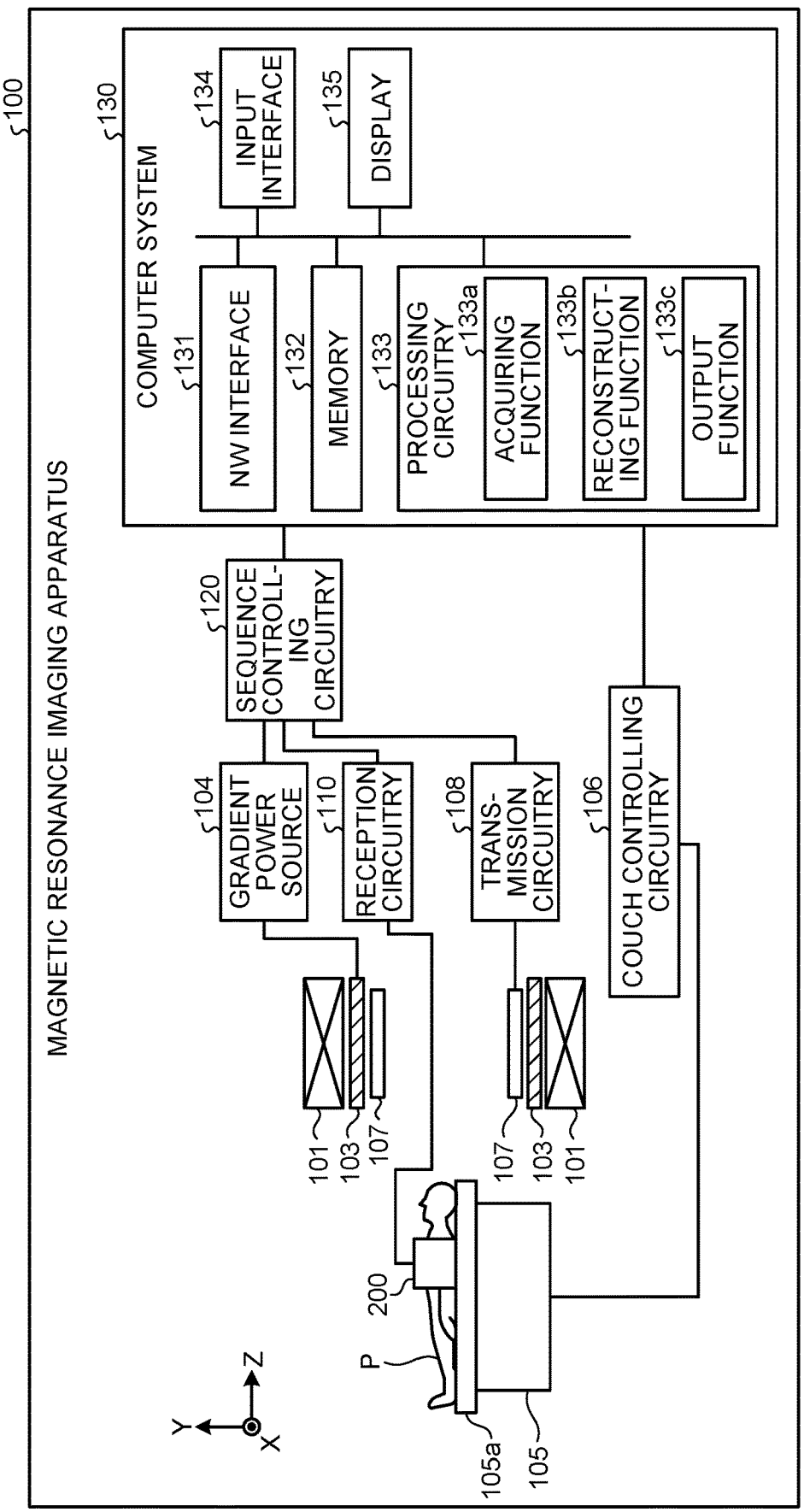
FIG. 1 is a block diagram illustrating an example of a magnetic resonance imaging apparatus using an array coil according to a first embodiment.

FIG. 1 is a block diagram illustrating a Magnetic Resonance Imaging (MRI) apparatus 100 using an array coil 200. As illustrated in FIG. 1, the magnetic resonance imaging apparatus 100 includes a static magnetic field magnet 101, a static magnetic field power source (not illustrated), a gradient coil 103, a gradient power source 104, a couch 105, couch controlling circuitry 106, a transmission coil 107, transmission circuitry 108, the array coil 200, reception circuitry 110, sequence controlling circuitry 120, and a computer system 130.

The configuration illustrated in FIG. 1 is merely an example. For instance, any of the functional units of the sequence controlling circuitry 120 and the computer system 130 may be integrated with or separated from one or more other functional units, as appropriate. The magnetic resonance imaging apparatus 100 does not include an examined subject (hereinafter, "patient") P (e.g., a human body). Further, the array coil 200 may be a part of the magnetic resonance imaging apparatus 100 or may be provided while not included in the magnetic resonance imaging apparatus 100.

The X-axis, Y-axis, and Z-axis illustrated in FIG. 1 structure an apparatus coordinate system unique to the magnetic resonance imaging apparatus 100. For example, the Z-axis direction coincides with the axial direction of the circular cylinder of the gradient coil 103 and is set along a magnetic flux of a static magnetic field generated by the static magnetic field magnet 101. The Z-axis direction is the same as the longitudinal direction of the couch 105. The X-axis direction is set along a horizontal direction orthogonal to the Z-axis direction. The Y-axis direction is set along a vertical direction orthogonal to the Z-axis direction.

The static magnetic field magnet 101 is a magnet formed to have a hollow and substantially circular cylindrical shape and is configured to generate the static magnetic field in the space on the inside thereof. For example, the static magnetic field magnet 101 is a superconductive magnet or the like and is magnetically excited by receiving a supply of an electric current from the static magnetic field power source. The static magnetic field power source is configured to supply the electric current to the static magnetic field magnet 101. In another example, the static magnetic field magnet 101 may be a permanent magnet. In that situation, the magnetic resonance imaging apparatus 100 does not necessarily have to include a magnetic static field power source. Further, the magnetic static field power source may be provided separately from the magnetic resonance imaging apparatus 100.

The gradient coil 103 is a coil formed to have a hollow and substantially cylindrical shape and is arranged on the inside of the static magnetic field magnet 101. The gradient coil 103 is formed by combining together three coils corresponding to the X-, Y-, and Z-axes that are orthogonal to one another. By individually receiving a supply of an electric current from the gradient power source 104, each of the three coils is configured to generate a gradient magnetic field of which the magnetic field intensity changes along the corresponding one of the X-, Y-, and Z-axes. Further, under control of the sequence controlling circuitry 120, the gradient power source 104 is configured to supply the electric currents to the gradient coil 103.

The couch 105 includes a couchtop 105a on which the patient P is placed. Under control of the couch controlling circuitry 106, the couchtop 105a is inserted into an image taking opening, while the patient P (e.g., a person seeking medical attention) is placed thereon. Under control of the computer system 130, the couch controlling circuitry 106 is configured to drive the couch 105 so as to move the couchtop 105*a* in longitudinal directions and up-and-down directions.

The transmission coil 107 is configured to magnetically excite an arbitrary region of the patient P, by applying a radio frequency magnetic field thereto. The transmission coil 107 is, for example, a whole body coil surrounding the whole body of the patient P. The transmission coil 107 is configured to generate the radio frequency magnetic field by receiving a supply of an RF pulse from the transmission circuitry 108 and to apply the radio frequency magnetic field to the patient P. Under control of the sequence controlling circuitry 120, the transmission circuitry 108 is configured to supply the RF pulse to the transmission coil 107. The transmission coil 107 may also serve as a reception coil. For example, the whole body coil may also function as a reception coil. Alternatively, the array coil 200 (explained later) may function as a transmission coil.

In the array coil 200, a plurality of reception coils (element coils) are provided. The array coil 200 is arranged in an imaged region and is configured to receive a magnetic resonance signal (MR signal) emitted from the patient P due to influence of the radio frequency magnetic field at the time of an imaging process performed by the MRI apparatus. Upon receipt of the MR signal, the array coil 200 is configured to output the received MR signal to the reception circuitry 110. Generally speaking, the array coil 200 is, in many situations, designed to acquire a signal from a specific body part (e.g., the head, the abdomen, an arm, a shoulder, a wrist, a knee, a leg, or the spine), in accordance with the imaged region.

The array coil 200 is an example of a radio frequency coil according to the present embodiment. In the following sections, the element coils included in the array coil 200 will be referred to as elements. A configuration of the array coil 200 will be explained in detail later.

The reception circuitry 110 is configured to generate Magnetic Resonance (MR) data by performing an Analog-to-Digital (A/D) conversion on the analog Magnetic Resonance (MR) signal output from the array coil 200. Further, the reception circuitry 110 is configured to transmit the generated MR data to the sequence controlling circuitry 120. Alternatively, the AD conversion may be performed in the array coil 200. Further, the reception circuitry 110 is also capable of performing arbitrary signal processing besides the AD conversion.

Further, the reception circuitry 110 is configured to transmit the generated magnetic resonance data to the sequence controlling circuitry 120. Alternatively, the reception circuitry 110 may be provided so as to belong to a gantry device including the static magnetic field magnet 101, the gradient coil 103, and the like.

The sequence controlling circuitry 120 is configured to perform an imaging process on the patient P, by driving the gradient power source 104, the transmission circuitry 108, and the reception circuitry 110 on the basis of the sequence information transmitted thereto from the computer system 130. In this situation, the sequence information is information defining a procedure for performing the imaging process. The sequence information defines: the intensity of the electric current to be supplied by the gradient power source 104 to the gradient coil 103 and the timing with which the electric current is to be supplied; the intensity of the RF pulse to be supplied by the transmission circuitry 108 to the transmission coil 107 and the timing with which the RF pulse is to be supplied; the timing with which the MR signal is to be detected by the reception circuitry 110; and the like.

The sequence controlling circuitry 120 may be realized by using a processor or may be realized by using a combination of software and hardware.

Further, upon receipt of the MR data from the reception circuitry 110 as a result of imaging the patient P by driving the gradient power source 104, the transmission circuitry 108, and the reception circuitry 110, the sequence controlling circuitry 120 is configured to transfer the received MR data to the computer system 130.

The computer system 130 is configured to control the entirety of the magnetic resonance imaging apparatus 100 and to generate MR images, among other processes. As illustrated in FIG. 1, the computer system 130 includes a network (NW) interface 131, a memory 132, processing circuitry 133, an input interface 134, and a display 135.

The NW interface 131 is configured to communicate with the sequence controlling circuitry 120 and the couch controlling circuitry 106. For example, the NW interface 131 is configured to transmit the sequence information to the sequence controlling circuitry 120. Further, the NW interface 131 is configured to receive the MR data from the sequence controlling circuitry 120.

The memory 132 is configured to store therein the MR data received by the NW interface 131, k-space data arranged in a k-space by the processing circuitry 133 (explained later), image data generated by the processing circuitry 133, and the like. For example, the memory 132 is a semiconductor memory element such as a Random Access Memory (RAM) or a flash memory, or a hard disk, an optical disk, or the like.

The input interface 134 is configured to receive inputs of various types of instructions and information from an operator. For example, the input interface 134 is realized by using a trackball, a switch button, a mouse, a keyboard, a touchpad on which an input operation can be performed by touching an operation surface thereof, a touch screen in which a display screen and a touchpad are integrally formed, contactless input circuitry using an optical sensor, audio input circuitry, and/or the like. The input interface is connected to the processing circuitry 133 and is configured to convert the input operations received from the operator into electrical signals and to output the electrical signals to the processing circuitry 133. In the present disclosure, the input interface does not necessarily have to include one or more physical operational component parts such as a mouse, a keyboard, and/or the like. Examples of the input interface include, for instance, electrical signal processing circuitry configured to receive electrical signals corresponding to input operations from an external input device provided separately from the computer system 130 and to output the electrical signals to control circuitry.

Under control of the processing circuitry 133, the display 135 is configured to display a Graphical User Interface (GUI) used for receiving an input of image taking conditions, images generated by the processing circuitry 133, and the like. For example, the display 135 is a display such as a liquid crystal display monitor.

The processing circuitry 133 is configured to control the entirety of the magnetic resonance imaging apparatus 100. More specifically, the processing circuitry 133 includes, in an example, an acquiring function 133*a*, a reconstructing function 133*b*, and an output function 133*c*. The acquiring function 133*a* is an example of an acquiring unit. The reconstructing function 133*b* is an example of a reconstructing unit. The output function 133*c* is an example of an output unit.

In this situation, for example, processing functions of the constituent elements of the processing circuitry 133, namely, the acquiring function 133*a*, the reconstructing function 133*b*, and the output function 133*c* are stored in the memory 132 in the form of computer-executable programs. The processing circuitry 133 is a processor. For example, the processing circuitry 133 is configured to realize the functions corresponding to the programs, by reading and executing the programs from the memory 132. In other words, the processing circuitry 133 that has read the programs has the functions illustrated within the processing circuitry 133 in FIG. 1. Although the example was explained with reference to FIG. 1 in which the single processor is configured to realize the processing functions implemented by the acquiring function 133*a*, the reconstructing function 133*b*, and the output function 133*c*, another arrangement is also acceptable in which the processing circuitry 133 is structured by combining together a plurality of independent processors, so that the functions are realized as a result of the processors executing the programs. Further, although the example was explained with reference to FIG. 1 in which the single memory (the memory 132) has stored therein the programs corresponding to the processing functions, another configuration is also acceptable in which a plurality of storage or memory are provided in a distributed manner, so that the processing circuitry 133 reads a corresponding program from each of the individual storage or memory.

The acquiring function 133*a* is configured to acquire the MR data converted from the MR signal to execute any of various types of pulse sequences, from the sequence controlling circuitry 120 via the input interface 134. Further, the acquiring function 133*a* is configured to arrange the acquired MR data according to a phase encode amount and a frequency encode amount applied by the gradient magnetic fields. The MR data arranged in the k-space will be referred to as k-space data. The k-space data is saved in the memory 132.

The reconstructing function 133*b* is configured to generate a magnetic resonance image on the basis of the k-space data stored in the memory 132. For example, the reconstructing function 133*b* is configured to generate the magnetic resonance image by executing a reconstructing process such as a Fourier transform on the k-space data. The reconstructing function 133*b* is configured to save the generated magnetic resonance image in the memory 132, for example.

Further, the output function 133*c* is configured to output the magnetic resonance image generated by the reconstructing function 133*b* to the display 135 and to cause the image to be displayed. Further, the output function 133*c* may exercise display control and cause the display 135 to display an operation screen using any of various types of GUIs.

In the description above, the example was explained in which the "processor" is configured to read and execute the programs corresponding to the functions from the memory; however, possible embodiments are not limited to this example. The term "processor" denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). When the processor is a CPU, for example, the processor realizes the functions by reading and executing the programs saved in the storage or the memory. In contrast, when the processor is an ASIC, the functions are directly incorporated in the circuitry of the processor as logic circuitry, instead of saving the programs in the memory. The processors of the present embodiment do not each necessarily have to be structured as a single circuit. It is also acceptable to structure one processor by combining together a plurality of independent circuits so as to realize the functions thereof. Further, it is also acceptable to integrate two or more of the constituent elements illustrated in FIG. 1 in one processor so as to realize the functions thereof.

Next, a configuration of the array coil 200 of the present embodiment will be explained. The array coil 200 of the present embodiment is configured to receive the magnetic resonance signal from the patient P, by using the plurality of element coils including an expandable and contractible first element and an expandable and contractible second element. Further, in addition to the functions of a reception coil, each of the element coils may also have functions of a transmission coil.

Figure 2:
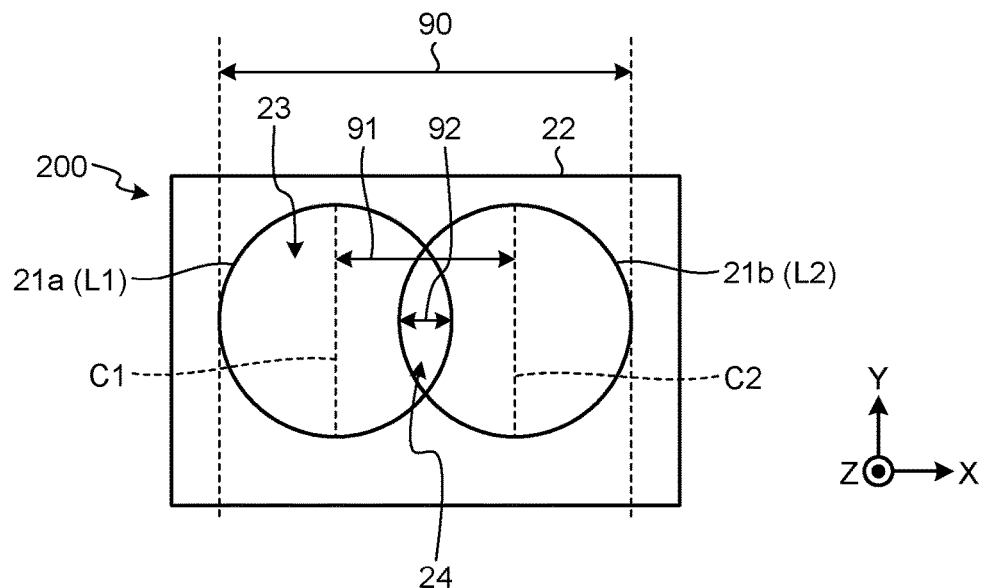
FIG. 2 is a drawing illustrating an example of the array coil according to the first embodiment.

FIG. 2 is a drawing illustrating an example of the array coil 200 according to the present embodiment. As illustrated in FIG. 2, the array coil 200 includes a first element 21*a*, a second element 21*b*, and a casing 22. Although omitted from FIG. 2, two or more other elements may further be included in the array coil 200. In the following sections, when not being particularly distinguished from each other, the first element 21*a* and the second element 21*b* may simply be referred to as elements 21.

Further, the array coil 200 may be fixed by using a hook-and-loop fastener or the like (not illustrated) while being wrapped around the patient P, like a supporter worn on a joint site, for example. Alternatively, the casing 22 may be structured by using a cloth material with expandability and contractibility being formed in a circular cylindrical shape. In other words, the casing 22 serves as a cover of the array coil 200.

The X, Y, and Z directions in FIG. 2 are provided for the purpose of clearly indicating the directions of the array coil 200. Accordingly, these directions do not necessarily match the coordinate system of the magnetic resonance imaging apparatus 100 illustrated in FIG. 1 where the direction of the static magnetic field is the Z direction. In the following sections, the X direction in FIG. 2 will be referred to as left-and-right directions of the array coil 200. The Y direction in FIG. 2 will be referred to as up-and-down directions of the array coil 200.

Further, although FIG. 2 depicts the first element 21*a* and the second element 21*b* as being exposed for the sake of convenience in the explanation, the first element 21*a* and the second element 21*b* are covered by the casing 22 in actuality.

The first element 21*a* and the second element 21*b* each have an annular shape. In the present embodiment, a loop formed by the first element 21*a* will be referred to as a first loop L1, whereas a loop formed by the second element will be referred to as a second loop L2. In the present embodiment, it is assumed that the sizes of the first loop L1 and the second loop L2 are substantially equal. However, the sizes of the first loop L1 and the second loop L2 do not necessarily have to be strictly equal and may be different within a prescribed range. In the following sections, when not being particularly distinguished from each other, the first loop L1 and the second loop L2 will simply be referred to as loops L. The size of each of the loops denotes the area of the region enclosed by the element 21, for example.

The first element 21*a* and the second element 21*b* according to the present embodiment include liquid metal in at least a part thereof. For example, the first element 21*a* and the second element 21b may each be configured by filling the inside of an expandable and contractible tube with the liquid metal. The type of the liquid metal is not particularly limited. Further, the material of the tube is not particularly limited, either.

Further, the casing 22 of the array coil 200 is also expandable and contractible. For example, the casing 22 may be made of cloth woven with an expandable and contractible fabric, for example, but is not limited to this example.

Further, as illustrated in FIG. 2, the first element 21a is arranged so as to overlap with a part of the second element 21b. Accordingly, the first loop L1 and the second loop L2 have an overlap region 24 where the two loops overlap with each other. In other words, the first loop L1 and the second loop L2 are arranged so that at least a part thereof overlap with each other.

In the present embodiment, the width in the left-and-right direction of the first element 21a and the second element 21b together will be referred to as a coil width 90. Further, the distance between the center C1 of the first element 21a in terms of the left-and-right direction and the center C2 of the second element 21b in terms of the left-and-right direction will be referred to as a coil center distance 91. Further, the width of the overlap region 24 between the first element 21a and the second element 21b will be referred to as an overlap width 92.

Further, of the first element 21a, a non-overlap region where the other element 21 is not overlapping is fixed to the casing 22. Similarly, of the second element 21b, a non-overlap region where the other element 21 is not overlapping is fixed to the casing 22. Although the fixing method is not particularly limited, the non-overlap region of the first element 21a may be sewn or pasted onto the casing 22, for example.

As for the overlap region 24, at least a part thereof is not fixed to the casing 22. For example, none of the overlap region 24 may be fixed to the casing 22. Alternatively, one part of the overlap region 24 may be fixed to the casing 22, while the other part of the overlap region 24 is not fixed to the casing 22.

When a medical technologist or the like expands the casing 22 to attach the array coil 200 to the patient P, the non-overlap regions of the first element 21a and the second element 21b expand together with the casing 22 by the same amount. Further, of the overlap region 24 between the first element 21a and the second element 21b, the part that is not fixed to the casing 22 does not expand by the same amount as the casing 22 does. For this reason, the expansion amount of the overlap region 24 is smaller than the expansion amounts of the non-overlap regions.

Figure 3:
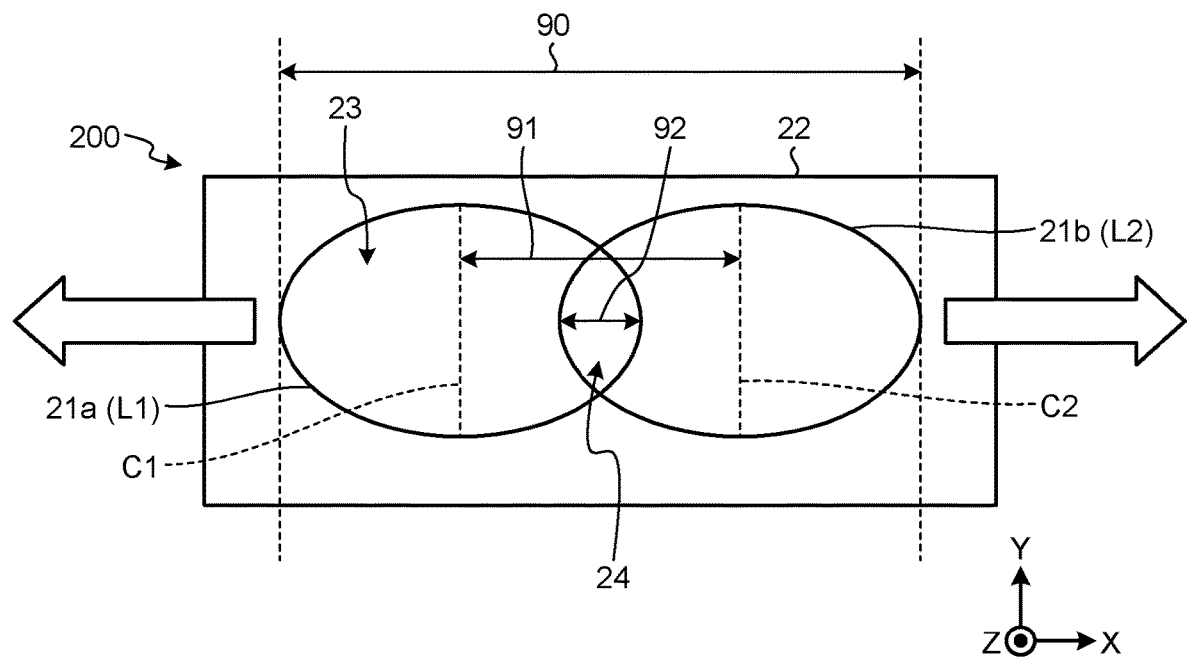
FIG. 3 is a drawing illustrating an example of an expanded state of the array coil according to the first embodiment.

FIG. 3 is a drawing illustrating an example of an expanded state of the array coil 200 according to the present embodiment. As an example, FIG. 3 illustrates a state of the array coil 200 after the coil width 90 has expanded in the left-and-right direction to 150% of that in the pre-expansion state of the array coil 200 illustrated in FIG. 2.

For example, as a result of the casing 22 expanding in the left-and-right direction, let us assume that the first element 21a as a whole has expanded in the left-and-right direction to 150%. In that situation, the expansion of the overlap region 24 in the left-and-right direction, i.e., the expansion amount of the overlap width 92 is smaller than 150%. For this reason, the ratio of the area of the overlap region 24 to the area of a region 23 enclosed by the first loop L1 changes in accordance with the expansion/contraction of the first element 21a forming the first loop L1. Similarly, the ratio of the area of the overlap region 24 to the area of the region enclosed by the second loop L2 also changes in accordance with the expansion/contraction of the second element 21b forming the second loop L2.

Although FIG. 3 illustrates the example in which the array coil 200 expands only in the left-and-right direction for the sake of convenience in the explanation, the array coil 200 may expand in the up-and-down direction in FIG. 3. In that situation also, the expansion amount of the overlap region 24 in the up-and-down direction is smaller than the expansion amount of each of the non-overlap regions in the up-and-down direction.

Next, functions of the overlap region 24 will be explained. In the array coil 200, coupling is inhibited by having the overlap region 24 between the first element 21a and the second element 21b positioned adjacent to each other. In other words, the overlap region 24 has a decoupling function.

Suppose that two element coils positioned adjacent to each other have no overlap region, a radio frequency magnetic field generated by the electric current flowing when one of the elements receives an MR signal would go through the inside of the loop of the other element, and an induced current would therefore flow in the other element that is not receiving the MR signal. As a result, what is called a coupling phenomenon (where an induced current flows due to a mutual induction between the elements) would occur between the elements positioned adjacent to each other. The occurrence of the coupling would lower the Signal-Noise Ratio (SNR) of the magnetic resonance signal received by the elements.

In contrast, when the two adjacently-positioned elements 21 have the overlap region 24 as described in the present embodiment, the radio frequency magnetic field generated by the electric current flowing when one of the elements 21 receives the MR signal is offset by the radio frequency magnetic field generated in the overlap region 24, and coupling is thus inhibited.

The area ratio of the overlap region 24 capable of appropriately achieving the decoupling effect is not constant at all times, but changes in accordance with the length of the coil center distance 91.

The area ratio of the overlap region 24 is the ratio of the area of the overlap region 24 to the area of the region 23 enclosed by the first loop L1. Alternatively, the ratio of the area of the overlap region 24 to the area of the region enclosed by the second loop L2 may be referred to as an area ratio of the overlap region 24.

As illustrated in FIG. 3, when the array coil 200 has expanded, the coil center distance 91 is longer than that before the expansion. When the coil center distance 91 is longer, the impact imposed on the adjacent second element 21b by the radio frequency magnetic field generated by the electric current flowing when the first element 21a receives the MR signal is smaller. For this reason, the longer the coil center distance 91 is, the smaller is an appropriate area of the overlap region 24 required to offset the radio frequency magnetic field.

Figure 4:
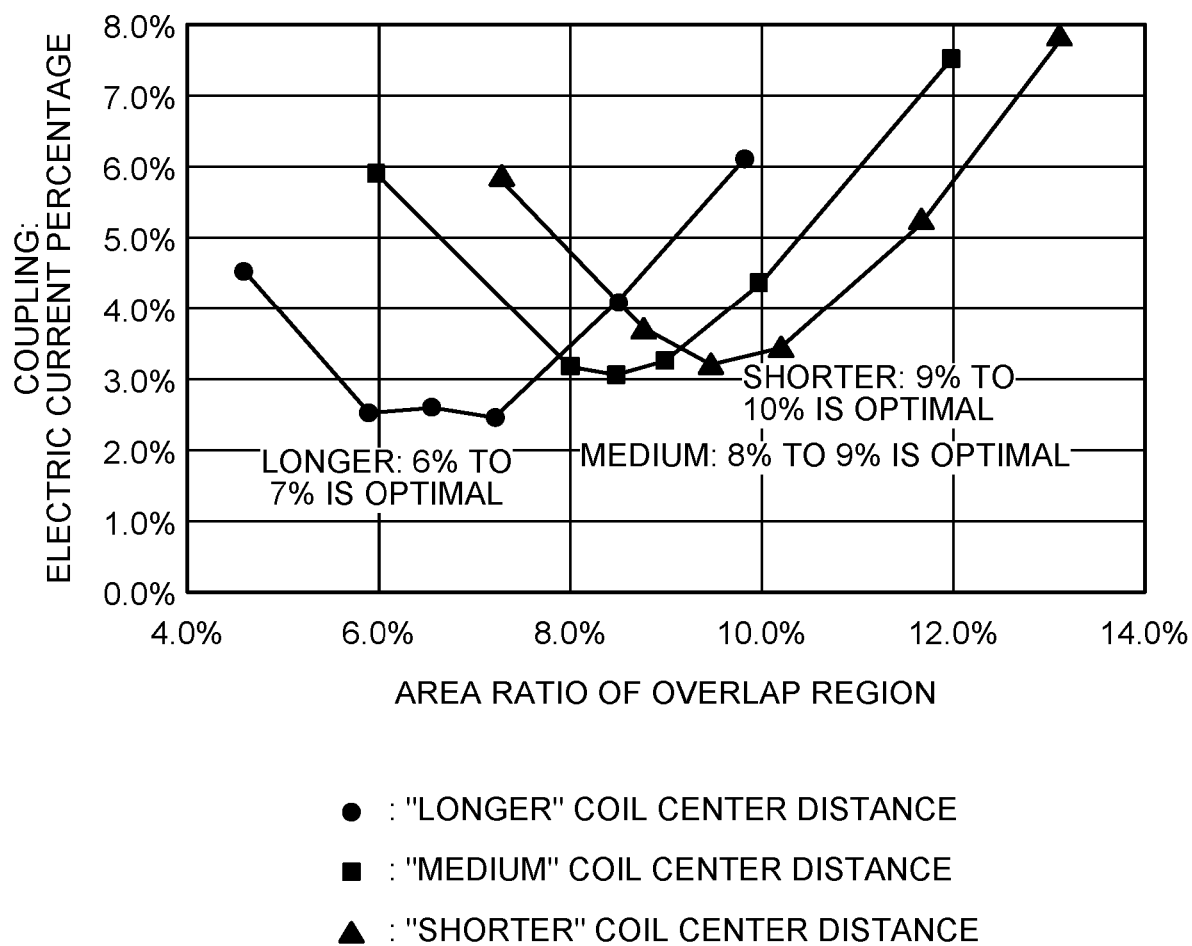
FIG. 4 is a chart illustrating an example of a relationship between coil center distances and a decoupling effect according to the first embodiment.

FIG. 4 is a chart illustrating an example of a relationship between coil center distances 91 and the decoupling effect according to the present embodiment. The horizontal axis of the chart in FIG. 4 expresses area ratios of the overlap region 24 to the area of the region 23 enclosed by the first loop L1. The vertical axis expresses percentages of the electric current flowing due to the coupling with the electric current flowing in the first element 21a. The higher the percentage of the electric current flowing due to the coupling is, the smaller the SNR of the magnetic resonance signal received by the first element 21a becomes.

In the example in FIG. 4, when the coil center distance 91 is longer, the area ratio of the overlap region 24 capable of keeping low the percentage of the electric current flowing due to the coupling is in the range of "6% to 7%". When the area ratio is larger or smaller than this range, the percentage of the electric current flowing due to the coupling increases.

In another example, when the length of the coil center distance 91 is medium, the area ratio of the overlap region 24 capable of keeping low the percentage of the electric current flowing due to the coupling is in the range of "8% to 9%". In yet another example, when the length of the coil center distance 91 is shorter, the area ratio of the overlap region 24 capable of keeping low the percentage of the electric current flowing due to the coupling is in the range of "9% to 10%".

The numerical values presented in FIG. 4 are merely examples, and the present disclosure is not limited to these examples. Further, the definitions of the coil center distance 91 being "longer", "medium", and "shorter" in FIG. 4 are not particularly limited. For example, the "shorter" distance may correspond to the coil center distance 91 in an initial state where the array coil 200 has not expanded. The "medium" distance may correspond to a coil center distance 91 observed when the coil width 90 is expanded by an amount equal to or larger than a first threshold value. The "longer" distance may correspond to a coil center distance 91 observed when the coil width 90 is expanded by an amount equal to or larger than a second threshold value, which is larger than the first threshold value.

Because the area ratio of the overlap region 24 is made close to an area ratio of the overlap region 24 optimal for the decoupling according to the rule explained above, the ratio of the area of the overlap region 24 to the area of the region 23 enclosed by the first loop L1 changes in such a manner that the area ratio decreases as the first element 21a and the second element 21b expand. More specifically, the ratio of the area of the overlap region 24 to the area of the region 23 enclosed by the first loop L1 changes in such a manner that the area ratio decreases as the coil center distance 91, which is the distance between the center C1 of the first element 21a and the center C2 of the second element 21b, becomes longer.

The array coil 200 according to the present embodiment does not necessarily have to keep the area ratio of the overlap region 24 optimal for the decoupling with respect to all of the three patterns in which the coil center distance 91 is "longer", "medium", and "shorter". For example, it is sufficient when the array coil 200 according to the present embodiment is configured so that the expansion amount of the overlap region 24 is smaller than the expansion amount of each of the non-overlap regions, and therefore, the overlap region 24 becomes closer to the optimal area ratio of the overlap region 24 than when the overlap region 24 expands by the same amount as each of the non-overlap regions does.

Further, within the overlap region 24, the larger the region not fixed to the casing 22 is, the larger is the region not impacted by the expansion of the casing 22. Accordingly, when the array coil 200 has expanded, the area ratio of the overlap region 24 tends to be smaller. Thus, depending on an expected expansion amount of the array coil 200, the size of the region within the overlap region 24 that is not fixed to the casing 22 may be determined. For example, there may be a plurality of types of array coils 200 to be attached to different body sites of the patient P. In that situation, the size of the region within the overlap region 24 that is not fixed to the casing 22 may vary among the different types of array coils 200.

As explained above, the array coil 200 according to the present embodiment has the overlap region 24 where the first loop L1 formed by the expandable and contractible first element 21a and the second loop L2 formed by the expandable and contractible second element 21b overlap with each other. The ratio of the area of the overlap region 24 to the area of the region 23 enclosed by the first loop L1 changes in accordance with the expansion/contraction of the first element 21a. With this configuration, even when the array coil 200 as a whole has expanded or contracted, it is possible to make the area ratio of the overlap region 24 close to an optimal area ratio of the overlap region 24 capable of keeping low the percentage of the electric current flowing due to the coupling. Consequently, by using the array coil 200 according to the present embodiment, even when the array coil 200 has expanded or contracted, it is possible to alleviate degradation of the decoupling function.

Further, the first element 21a and the second element 21b of the array coil 200 according to the present embodiment include the liquid metal in at least a part thereof. Consequently, in the array coil 200 according to the present embodiment, it is possible to provide the first element 21a and the second element 21b with high expandability and contractibility and high plasticity, by wrapping the liquid metal with the tube made of a material having high expandability and contractibility and high plasticity. As a result of providing the array coil 200 with the high expandability and contractibility and the high plasticity, a medical technologist or the like is able to easily attach the array coil 200 so as to be in close contact with the body of the patient P.

Further, in the array coil 200 according to the present embodiment, the ratio of the area of the overlap region 24 to the area of the region 23 enclosed by the first loop L1 changes in such a manner that the area ratio decreases as the first element 21a and the second element 21b expand. With this configuration, by using the array coil 200 according to the present embodiment, it is possible to make the area ratio of the overlap region 24 close to an area ratio of the overlap region 24 optimal for the decoupling.

Further, in the array coil 200 according to the present embodiment, of the first loop L1 and the second loop L2, the non-overlap regions where the two loops do not overlap with each other are fixed to the expandable and contractible casing 22. Further, at least a part of the overlap region 24 where the first loop L1 and the second loop L2 overlap with each other is not fixed to the casing 22. For this reason, when a medical technologist or the like expands the casing 22 of the array coil 200, although the non-overlap regions expand by the same amount as the casing 22 does, the part of the overlap region 24 that is not fixed to the casing 22 does not expand. Accordingly, the expansion amount of the overlap region 24 is smaller than the expansion amount of each of the non-overlap regions. With this configuration, when the array coil 200 according to the present embodiment is used, by ensuring that the expansion amount of the overlap region 24 is smaller than the expansion amount of each of the non-overlap regions when the array coil 200 as a whole expands, it is possible to make the area ratio of the overlap region 24 close to an area ratio of the overlap region 24 capable of keeping low the percentage of the electric current flowing due to the coupling.

More specifically, in the array coil 200 according to the present embodiment, the ratio of the area of the overlap region 24 to the area of the region 23 enclosed by the first loop L1 changes in such a manner that the area ratio decreases as the coil center distance 91, which is the distance between the center C1 of the first element 21a and the center C2 of the second element 21b, becomes longer. Because the appropriate area of the overlap region 24 required to offset the radio frequency magnetic field decreases as the coil center distance 91 becomes longer, it is possible, by using the array coil 200 according to the present embodiment, to make the area ratio of the overlap region 24 close to an area ratio of the overlap region 24 optimal for the decoupling.

Second Embodiment

In the first embodiment above, the example was explained in which at least a part of the overlap region 24 between the first element 21a and the second element 21b of the array coil 200 is not fixed to the casing 22. In the present embodiment, at least a part of the overlap region 24 is fixed to a member having lower expandability and contractibility than those of the casing 22.

Figure 5:
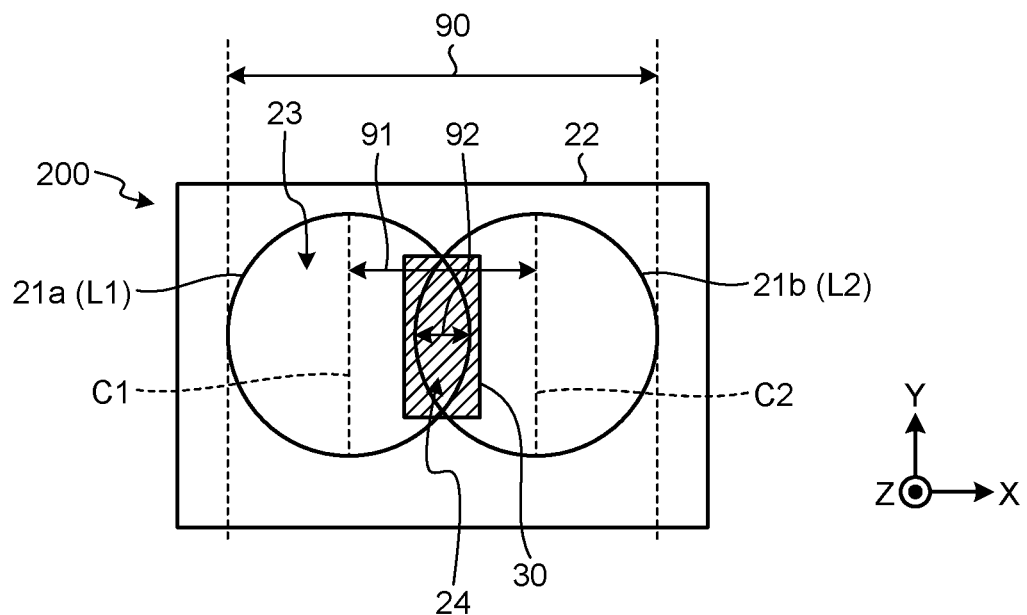
FIG. 5 is a drawing illustrating an example of an array coil according to a second embodiment.

FIG. 5 is a drawing illustrating an example of the array coil 200 according to the present embodiment. As illustrated in FIG. 5, the array coil 200 according to the present embodiment includes the first element 21a, the second element 21b, the casing 22, and a fixing member 30.

The fixing member 30 has lower expandability and contractibility than those of the casing 22. For example, the fixing member 30 may be made of a resin material having low expandability and contractibility; however, possible embodiments are not limited to this example. It is acceptable even when the fixing member 30 has no expandability/contractibility. In the present embodiment, as an example, the fixing member 30 is a resin plate having low expandability and contractibility. The fixing member 30 is an example of the plate.

At least a part of the overlap region 24 where the first element 21a and the second element 21b according to the present embodiment overlap with each other is fixed to the fixing member 30. In FIG. 5, as an example, the entirety of the overlap region 24 is fixed to the fixing member 30.

Further, the fixing member 30 is not fixed to the casing 22.

As explained above, in the array coil 200 according to the present embodiment, at least a part of the overlap region 24 is fixed to the fixing member 30 having lower expandability and contractibility than those of the casing 22. Accordingly, it is possible to reduce the impact imposed by the expansion of the entire array coil 200 on the overlap region 24, while achieving the advantageous effects of the first embodiment.

Further, in the array coil 200 according to the present embodiment, because the overlap region 24 is fixed to the fixing member 30, it is possible to reduce the possibility of the size of the overlap region 24 changing due to causes such as a positional shift or deformation of the first element 21a and the second element 21b.

Third Embodiment

In a third embodiment, the array coil 200 further has markers that help a medical technologist or the like understand an optimal expansion amount.

Figure 6:
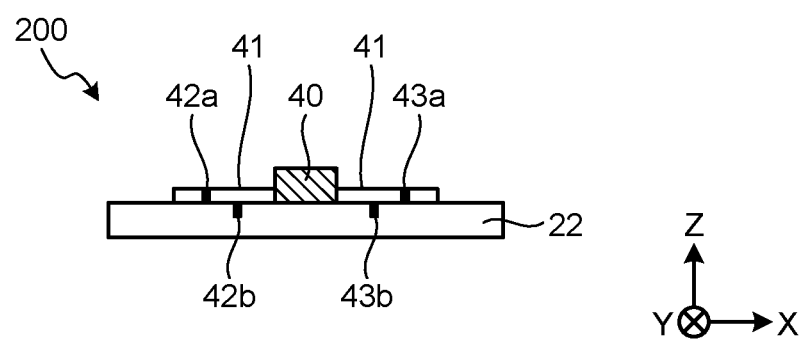
FIG. 6 is a drawing illustrating an example of a side view of an array coil according to a third embodiment.

FIG. 6 is a drawing illustrating an example of a side view of the array coil 200 according to the present embodiment. As illustrated in FIG. 6, the array coil 200 according to the present embodiment includes, on the casing 22, a transparent film 41 and a fixing member 40 configured to fix the film 41 onto the casing 22.

Further, the first element 21a and the second element 21b are covered by the casing 22. For example, similarly to the first embodiment, the first element 21a and the second element 21b have the overlap region 24 where the first loop L1 and the second loop L2 overlap with each other, while at least a part of the overlap region 24 is not fixed to the casing 22. Alternatively, similarly to the second embodiment, at least a part of the overlap region 24 may be fixed to the fixing member 30. In that situation, the fixing member 30 is also covered by the casing 22. When being distinguished from each other, the fixing member 30 and the fixing member 40 may be referred to as a first fixing member 30 and a second fixing member 40.

The film 41 has a marker 42a and a marker 43a indicated thereon. For example, the marker 42a and the marker 43a are positioned to be symmetric with respect to the centerline of the film 41 in the left-and-right direction.

On a surface of the casing 22 according to the present embodiment that opposes the film 41, a marker 42b and a marker 43b are indicated. For example, the marker 42b and the marker 43b are markers indicating an expanded/contracted state in which the ratio of the area of the overlap region 24 to the area of the region 23 enclosed by the first loop L1 is equal to a prescribed value.

The prescribed value according to the present embodiment is an area ratio of the overlap region 24 that is optimal for achieving the decoupling effect. When the ratio of the area of the overlap region 24 to the area of the region 23 enclosed by the first loop L1 is equal to the prescribed value, the SNR of the magnetic resonance signal received by the first element 21a and the second element 21b is equal to or larger than a threshold value. The threshold value for the SNR is an SNR value observed when the first element 21a and the second element 21b appropriately achieve the decoupling effect.

For example, the marker 42b and the marker 43b are positioned to be symmetric with respect to the centerline, in terms of the left-and-right direction, between the first element 21a and the second element 21b covered by the casing 22, i.e., a line passing through the center of the coil width 90.

In this situation, the film 41 does not necessarily have to be completely transparent. It is sufficient when the film 41 has transparency that makes it possible to visually recognize the markers 42b and 43b indicated on the casing 22 through the film 41.

Next, a method for using the markers 42a, 43a, 42b, and 43b will be explained, with reference to FIGS. 7 and 8.

Figure 7:
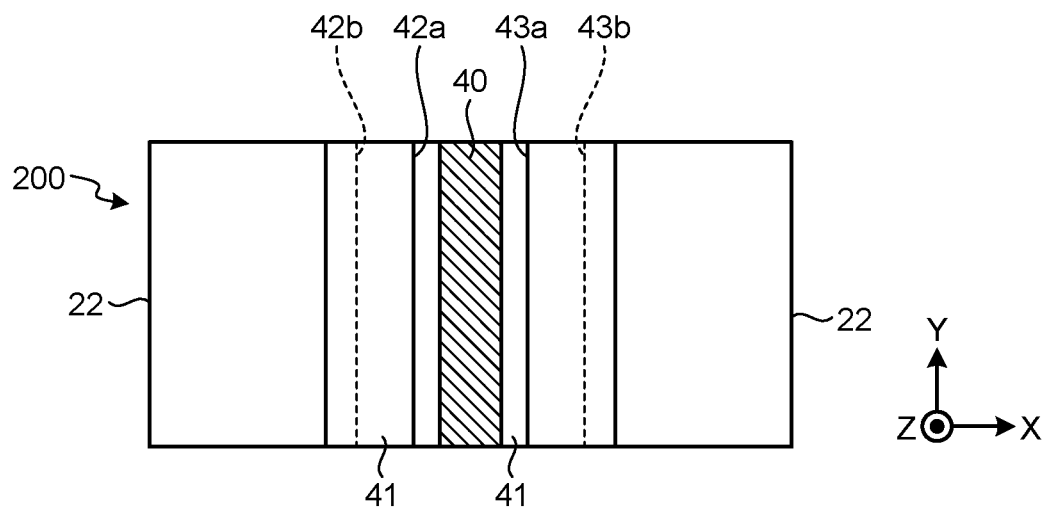
FIG. 7 is a drawing illustrating an example of a pre-expansion state of the array coil according to the third embodiment.

FIG. 7 is a drawing illustrating an example of a pre-expansion state of the array coil 200 according to the present embodiment. In other words, FIG. 7 illustrates the array coil 200 in the initial state before the expansion. In this state, the marker 42a indicated on the film 41 and the marker 42b indicated on the casing 22 do not overlap with each other. Also, in this situation, the marker 43a indicated on the film 41 and the marker 43b indicated on the casing 22 do not overlap with each other, either.

Figure 8:
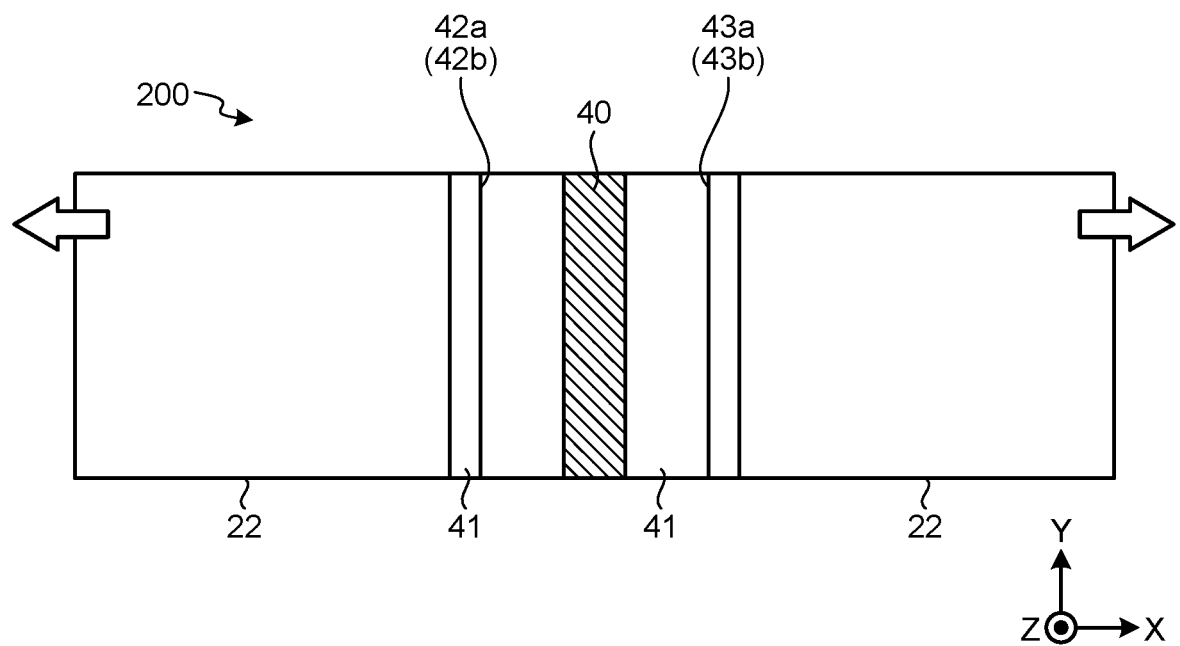
FIG. 8 is a drawing illustrating an example of an expanded state of the array coil according to the third embodiment.

Further, FIG. 8 is a drawing illustrating an example of an expanded state of the array coil 200 according to the present embodiment. For example, FIG. 8 illustrates the state when a medical technologist or the like has expanded the array coil 200 in the left-and-right direction. In FIG. 8, the array coil 200 has been expanded up to certain positions where the marker 42a indicated on the film 41 overlaps with the marker 42b indicated on the casing 22, while the marker 43a indicated on the film 41 overlaps with the marker 43b indicated on the casing 22.

The markers 42a, 43a, 42b, and 43b are the markers that help the medical technologist or the like to understand the expanded position of the array coil 200 that makes the area ratio of the overlap region 24 equal to a value optimal for achieving the decoupling effect.

The medical technologist or the like looks at the markers 42a, 43a, 42b, and 43b while expanding the array coil 200, so as to expand the array coil 200 up to the positions that make the markers 42a and 42b and the markers 43a and 43b overlap with each other, as illustrated in FIG. 8. When the array coil 200 has expanded up to the positions that allow the markers 42a and 42b and the markers 43a and 43b to overlap with each other, the area ratio of the overlap region 24 is equal to the value optimal for achieving the decoupling effect.

When the expansion amount of the array coil 200 is smaller than the state illustrated in FIG. 8, the area ratio of the overlap region 24 would be larger than the value optimal for achieving the decoupling effect, and the decoupling effect would be degraded. In that situation, the SNR of the magnetic resonance signal received by the first element 21a and the second element 21b would be lowered.

Conversely, when the expansion amount of the array coil 200 is larger than the state illustrated in FIG. 8, the area ratio of the overlap region 24 would be smaller than the value optimal for achieving the decoupling effect, and in this situation also, the decoupling effect would be degraded. In this situation also, the SNR of the magnetic resonance signal received by the first element 21a and the second element 21b would be lowered.

As explained above, the casing 22 of the array coil 200 according to the present embodiment has the markers 42b and 43b indicating the expanded/contracted state in which the ratio of the area of the overlap region 24 to the area of the region 23 enclosed by the first loop L1 is equal to the prescribed value. Consequently, while achieving the advantageous effects of the first embodiment or the second embodiment, the array coil 200 according to the present embodiment enables the medical technologist or the like to understand the expanded state optimal for the array coil 200 to achieve the decoupling effect, at the time of attaching the array coil 200 to the patient P. In other words, the medical technologist or the like is able to understand how much he/she needs to pull the array coil 200. It is therefore possible to easily attach the array coil 200 while taking the decoupling effect into consideration.

In the present embodiment, the example was explained in which the film 41 is attached to the outside of the casing 22; however, a structure including the film 41 may be referred to as the casing 22.

Further, the display modes of the markers 42a, 43a, 42b, and 43b illustrated in FIGS. 7 and 8 are merely examples. It is acceptable to use any other mode.

First Modification Example

As described in the above embodiments, the elements 21 are expandable and contractible. When the elements 21 are expanded or contracted, the thicknesses of the elements 21 change. Accordingly, the inductance levels of the elements 21 also change.

For example, when the thicknesses of the elements 21 become smaller, the inductance values of the elements 21 increase. Accordingly, the area of the overlap region 24 to be adjusted for the decoupling may be adjusted while taking the changes in the inductance values into account.

Second Modification Example

In the embodiments described above, the example was explained in which the first element 21a and the second element 21b are the tubes that are expandable and contractible and are filled with the liquid metal; however, possible configurations of the first element 21a and the second element 21b are not limited to this example.

For instance, the first element 21a and the second element 21b may be expandable and contractible while metal threads are braided together in the manner of a braided cord. Although the material of the metal threads is not particularly limited, the metal threads may be made of copper. The metal threads braided in the manner of a braided cord is an example of a material being expandable and contractible in the present modification example. Further, the first element 21a and the second element 21b may be configured by using any other material that is expandable and contractible.

According to at least one aspect of the embodiments described above, it is possible to alleviate the degradation of the decoupling function even when the radio frequency coil is expanded or contracted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency coil configured to receive a magnetic resonance signal from an examined subject, comprising:
   an expandable and contractible first element; and
   an expandable and contractible second element,
   wherein when the first element and the second element are expanded or contracted, a part of the first element that forms an overlap region where a first loop formed by the first element overlaps with a second loop formed by the second element does not expand or contract as much as another part of the first element.

2. The radio frequency coil according to claim 1, wherein at least a part of the first element and the second element is fixed to a cover, and by the cover, when the first element and the second element are expanded or contracted, a part of the first element that forms an overlap region where a first loop formed by the first element overlaps with a second loop formed by the second element does not expand or contract as much as another part of the first element.

3. The radio frequency coil according to claim 2, wherein the cover is made of cloth woven with an expandable and contractible fabric.

4. The radio frequency coil according to claim 2, wherein
   a non-overlap region where the first and the second loops do not overlap with each other is fixed to a cover that is expandable and contractible, and
   at least a part of the overlap region is not fixed to the cover.

5. The radio frequency coil according to claim 4, wherein the non-overlap region of the first element is sewn or pasted onto the cover.

6. The radio frequency coil according to claim 4, wherein the size of the region within the overlap region that is not fixed to the cover varies among different types of array coils.

7. The radio frequency coil according to claim 1, wherein a ratio of an area of the overlap region to an area of a region enclosed by the first loop changes in accordance with expansion/contraction of the first element forming the first loop.

8. The radio frequency coil according to claim 7, wherein the ratio decreases as the first element and the second element expand.

9. The radio frequency coil according to claim 7, wherein that the ratio decreases as a distance between a center of the first element and a center of the second element becomes longer.

10. The radio frequency coil according to claim 7, wherein
at least a part of the overlap region is fixed to a plate having lower expandability and contractibility than those of the cover, and
the plate is not fixed to the cover.

11. The radio frequency coil according to claim 10, wherein the cover includes a marker indicating an expanded/contracted state in which the ratio is equal to a prescribed value.

12. The radio frequency coil according to claim 11, wherein, when the ratio is equal to the prescribed value, a Signal-Noise Ratio (SNR) of the magnetic resonance signal received by the first element and the second element is equal to or larger than a threshold value.

13. The radio frequency coil according to claim 1, wherein the first element and the second element include liquid metal in at least a part thereof.

14. The radio frequency coil according to claim 1, wherein the first element expands or contracts in a left-and-right direction.

15. The radio frequency coil according to claim 1, wherein the first element expands or contracts in an up-and-down direction.

16. The radio frequency coil according to claim 1, wherein an area of the overlap region to be adjusted for decoupling is adjusted while taking into account changes in inductance values.

17. The radio frequency coil according to claim 1, wherein the first element and the second element are expandable and contractible while metal threads are braided together in a manner of a braided cord.

18. A radio frequency coil configured to receive a magnetic resonance signal from an examined subject comprising:
an expandable and contractible first element; and
an expandable and contractible second element, wherein
the radio frequency coil has an overlap region where a first loop formed by the first element overlaps with a second loop formed by the second element,
a ratio of an area of the overlap region to an area of a region enclosed by the first loop changes in accordance with expansion/contraction of the first element forming the first loop,
the first element and the second element include liquid metal in at least a part thereof,
a non-overlap region where the first and the second loops do not overlap with each other is fixed to a cover that is expandable and contractible, and
at least a part of the overlap region is not fixed to the cover.

19. The radio frequency coil according to claim 18, wherein
at least a part of the overlap region is fixed to a plate having lower expandability and contractibility than those of the cover, and
the plate is not fixed to the cover.

20. The radio frequency coil according to claim 19, wherein the cover includes a marker indicating an expanded/contracted state in which the ratio is equal to a prescribed value.

* * * * *